US009767226B2

(12) United States Patent
Chen et al.

(10) Patent No.: US 9,767,226 B2
(45) Date of Patent: Sep. 19, 2017

(54) SYSTEM AND METHOD FOR DESIGNING THREE-DIMENSIONAL OBJECTS

(71) Applicant: Massachusetts Institute of Technology, Cambridge, MA (US)

(72) Inventors: Desai Chen, Cambridge, MA (US); Pitchaya Sitthi-Amorn, Cambridge, MA (US); David I. W. Levin, Boston, MA (US); Piotr Didyk, Swiebodzice (PL); Wojciech Matusik, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 618 days.

(21) Appl. No.: 14/316,333

(22) Filed: Jun. 26, 2014

(65) Prior Publication Data
US 2015/0066440 A1 Mar. 5, 2015

Related U.S. Application Data

(60) Provisional application No. 61/839,975, filed on Jun. 27, 2013.

(51) Int. Cl.
G06F 17/50 (2006.01)
G06T 17/00 (2006.01)
B33Y 70/00 (2015.01)

(52) U.S. Cl.
CPC .......... G06F 17/50 (2013.01); G06F 17/5009 (2013.01); G06T 17/00 (2013.01); B33Y 70/00 (2014.12)

(58) Field of Classification Search
CPC ....................................................... B33Y 70/00
USPC ............................................................. 703/1
See application file for complete search history.

(56) References Cited

PUBLICATIONS

Silverstein: MIT Researchers Come Up with New Methods to Simplify 3D Printing; TechZone360; Jul. 25, 2013; 4 pp.*
Chen et al.: Spec2Fab: A Reducer-Tuner Model for Translating Specifications to 3D Prints; ACM Transactions on Graphics (TOG)—SIGGRAPH 2013 Conference Proceedings; vol. 32 Issue 4, Jul. 2013; Article No. 135; 9 pp.*
Alexa, M., and Matusik, W., "Reliefs as images," ACM Trans. on Graphics (SIGGRAPH 2010) 29, 4, Jul. 2010, pp. 60:1-60:7.
(Continued)

Primary Examiner — Hugh Jones
(74) Attorney, Agent, or Firm — Wolf, Greenfield & Sacks, P.C.

(57) ABSTRACT

According to some aspects, a method of designing an object based on a three-dimensional model representing a shape of the object is provided. The object may be fabricated from a plurality of materials having one or more known physical properties, wherein the object is designed to exhibit one or more target properties. The method may comprise determining a first composition of the object by providing the three-dimensional model as input to a reducer tree, determining one or more physical properties of the object with the first composition by simulating the object with the first composition, comparing the determined one or more physical properties with the one or more target properties, and determining a second composition of the object based on a result of comparing the determined one or more physical properties with the one or more target properties.

27 Claims, 9 Drawing Sheets

(56) References Cited

PUBLICATIONS

Baran, I., Keller, P., Bradley, D., Coros, S., Jarosz, W., Nowrouzezahrai, D., and Gross, M., "Manufacturing layered attenuators for multiple prescribed shadow images," Computer Graphics Forum 31, 2, May 2012, pp. 603-610.

Bermano, A., Baran, I., Alexa, M., and Matusik, W., "ShadowPIX: Multiple images from self-shadowing," Computer Graphics Forum 31, 2, May 2012, pp. 593-602.

Bickel, B., Bacher, M., Otaduy, M. A., Lee, H. R., Pfister, H., Gross, M., and Matusik, W., "Design and fabrication of materials with desired deformation behavior," ACM Trans. on Graphics (SIGGRAPH 2010) 29, 4, Jul. 2010, pp. 63:1-63:10.

Bickel, B., Bacher, M., Otaduy, M. A., Matusik, W., Pfister, H., and Gross, M., "Capture and modeling of non-linear heterogeneous soft tissue," ACM Trans. on Graphics (SIGGRAPH 2009) 28, 3, Jul. 2009, pp. 89:1-89:9.

Bickel, B., Kaufmann, P., Skouras, M., Thomaszewski, B., Bradley, D., Beeler, T., Jackson, P., Marschner, S., Matusik, W., and Gross, M., "Physical face cloning. ACM Trans.," on Graphics (SIGGRAPH 2012) 31, 4, Jul. 2012, pp. 118:1-118:10.

Cook, R. L., "Shade trees," Computer Graphics (SIGGRAPH 84) 18, 3, Jul. 1984, pp. 223-231.

Cutler, B., Dorsey, J., McMillan, L., Muller, M., and Jagnow, R., "A procedural approach to authoring solid models," ACM Trans. on Graphics (SIGGRAPH 2002) 21, 3, Jul. 2002, pp. 302-311.

Dong, Y., Wang, J., Pellacini, F., Tong, X., and Guo, B., "Fabricating spatially-varying subsurface scattering," ACM Trans. on Graphics (SIGGRAPH 2010) 29, 4, Jul. 2010, pp. 62:1-62:10.

Finckh, M., Dammertz, H., and Lensch, H. P. A., "Geometry construction from caustic images," Computer Vision (ECCV 2010) 6315, (2010), pp. 464-477.

Hasan, M., Fuchs, M., Matusik, W., Pfister, H., and Rusinkiewicz, S., "Physical reproduction of materials with specified subsurface scattering," ACM Trans. on Graphics (SIGGRAPH 2010) 29, 4, Jul. 2010, pp. 61:1-61:10.

Jackson, T. R., "Analysis of Functionally Graded Material Object Representation Methods," PhD thesis, Massachusetts Institute of Technology, Jun. 2000, 224 pages.

Jordan, M., Ghahramani, Z., Jaakkola, T., and Saul, L., "An introduction to variational methods for graphical models," Machine Learning 37, (1999), pp. 183-233.

Kennedy, J., and Eberhart, R., "Particle swarm optimization," in Neural Networks, Proceedings., IEEE International Conference on, vol. 4, IEEE, (1999), pp. 1942-1948.

Kou, X., and Tan, S., "Heterogeneous object modeling: A review," Computer-Aided Design 39, 4, (2007), pp. 284-301.

Kou, X., Parks, G., and Tan, S., "Optimal design of functionally graded materials using a procedural model and particle swarm optimization," Computer-Aided Design 44, 4, (2012), pp. 300-310.

Kumar, V., Burns, D., Dutta, D., and Hoffmann, C., "A framework for object modeling," Computer-Aided Design 31, 9, (1999), pp. 541-556.

Low, Y., Gonzalez, J., Kyrola, A., Bickson, D., Guestrin, C., and Hellerstein, J. M., "Graphlab: A new parallel framework for machine learning," Conference on Uncertainty in Artificial Intelligence (UAI), Jul. 2010, 10 pages.

Malzbender, T., Samadani, R., Scher, S., Crume, A., Dunn, D., and Davis, J., "Printing reflectance functions," ACM Trans. on Graphics (SIGGRAPH 2012) 31, 3, May 2012, pp. 20:1-20:11.

Matusik, W., Ajdin, B., Gu, J., Lawrence, J., Lensch, H. P. A., Pellacini, F., and Rusinkiewicz, S., "Printing spatially-varying reflectance," ACM Trans. on Graphics (SIGGRAPH Asia 2009) 28, 5, Dec. 2009, pp. 128:1-128:9.

Mitra, N. J., and Pauly, M., "Shadow art," ACM Trans. on Graphics (SIGGRAPH Asia 2009) 28, 5, Dec. 2009, pp. 156:1-156:7.

Papas, M., Houit, T., Nowrouzezahrai, D., Gross, M., and Jarosz, W., "The magic lens: refractive steganography," ACM Trans. on Graphics (SIGGRAPH Asia 2012) 31, 6, Nov. 2012, pp. 186:1-186:10.

Papas, M., Jarosz, W., Jakob, W., Rusinkiewicz, S., Matusik, W., and Weyrich, T., "Goal-based caustics," Computer Graphics Forum 30, 2, (2011), pp. 503-511.

Skouras, M., Thomaszewski, B., Bickel, B., and Gross, M., "Computational design of rubber balloons," Computer Graphics Forum 31, 2, May 2012, pp. 835-844.

Vidimce, K., Wang, S.-P., Ragan-Kelley, J., and Matusik, W., "OpenFab: A programmable pipeline for multi-material fabrication," ACM Trans. on Graphics (SIGGRAPH 2013) 32, 4, Jul. 2013, 11 pages.

Weyrich, T., Peers, P., Matusik, W., and Rusinkiewicz, S., "Fabricating microgeometry for custom surface reflectance," ACM Trans. on Graphics (SIGGRAPH 2009) 28, 3, Jul. 2009, pp. 32:1-32:6.

International Search Report and Written Opinion for Application No. PCT/US2014/044431 mailed Oct. 30, 2014, 8 pp.

International Preliminary Report on Patentability for Application No. PCT/US2014/044431 mailed Jan. 7, 2016, 8 pp.

Neumann, First Draft of a Report on the EDVAC. IEEE Annals of the History of Computing. 1993;15(4):27-75.

* cited by examiner

SYSTEM AND METHOD FOR DESIGNING THREE-DIMENSIONAL OBJECTS

RELATED APPLICATIONS

The present application claims the benefit of U.S. Provisional Patent Application No. 61/839,975, filed Jun. 27, 2013, titled "Spec2Fab: A Reducer-Tuner Model for Translating Specifications to 3D Prints," which is hereby incorporated by reference in its entirety.

STATEMENT REGARDING FEDERALLY SPONSORED RESEARCH OR DEVELOPMENT

This invention was made with government support under Grant Nos. IIS-1116296 and IIS-1111415 awarded by the National Science Foundation and under Contract No. N66001-12-1-4242 awarded by the Space and Naval Warfare Systems Center. The government has certain rights in the invention.

BACKGROUND

Additive fabrication, e.g., 3-dimensional (3D) printing, provides techniques for fabricating objects, typically by causing portions of a building material to solidify and/or combine at specific locations. Additive fabrication techniques may include stereolithography, selective or fused deposition modeling, direct composite manufacturing, laminated object manufacturing, selective phase area deposition, multi-phase jet solidification, ballistic particle manufacturing, particle deposition, laser sintering, polyjet, or combinations thereof. Many additive fabrication techniques build parts by forming successive layers, which are typically cross-sections of the desired object. Typically each layer is formed such that it adheres to either a previously formed layer or a substrate upon which the object is built.

SUMMARY

Some embodiments include a method of designing an object based on a three-dimensional model representing a shape of the object, the object to be fabricated from a plurality of materials having one or more known physical properties, wherein the object is designed to exhibit one or more target properties, comprising determining a first composition of the object by providing the three-dimensional model as input to a reducer tree, the reducer tree being configured to identify a first plurality of sub-regions of the model each having a size and a shape, and to select a material of the plurality of materials for each of the first plurality of sub-regions, determining one or more physical properties of the object with the first composition by simulating the object with the first composition, comparing the determined one or more physical properties with the one or more target properties, and determining, by the reducer tree, a second composition of the object based on a result of comparing the determined one or more physical properties with the one or more target properties by identifying a second plurality of sub-regions of the model and selecting one of the plurality of materials for each of the second plurality of identified sub-regions.

Some embodiments provide at least one computer-readable medium comprising instructions that, when executed, perform a method of designing an object based on a three-dimensional model representing a shape of the object, the object to be fabricated from a plurality of materials having one or more known physical properties, wherein the object is designed to exhibit one or more target properties, the method comprising determining a first composition of the object by providing the three-dimensional model as input to a reducer tree, the reducer tree being configured to identify a first plurality of sub-regions of the model each having a size and a shape, and to select a material of the plurality of materials for each of the first plurality of sub-regions, determining one or more physical properties of the object with the first composition by simulating the object with the first composition, comparing the determined one or more physical properties with the one or more target properties, and determining, by the reducer tree, a second composition of the object based on a result of comparing the determined one or more physical properties with the one or more target properties by identifying a second plurality of sub-regions of the model and selecting one of the plurality of materials for each of the second plurality of identified sub-regions.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
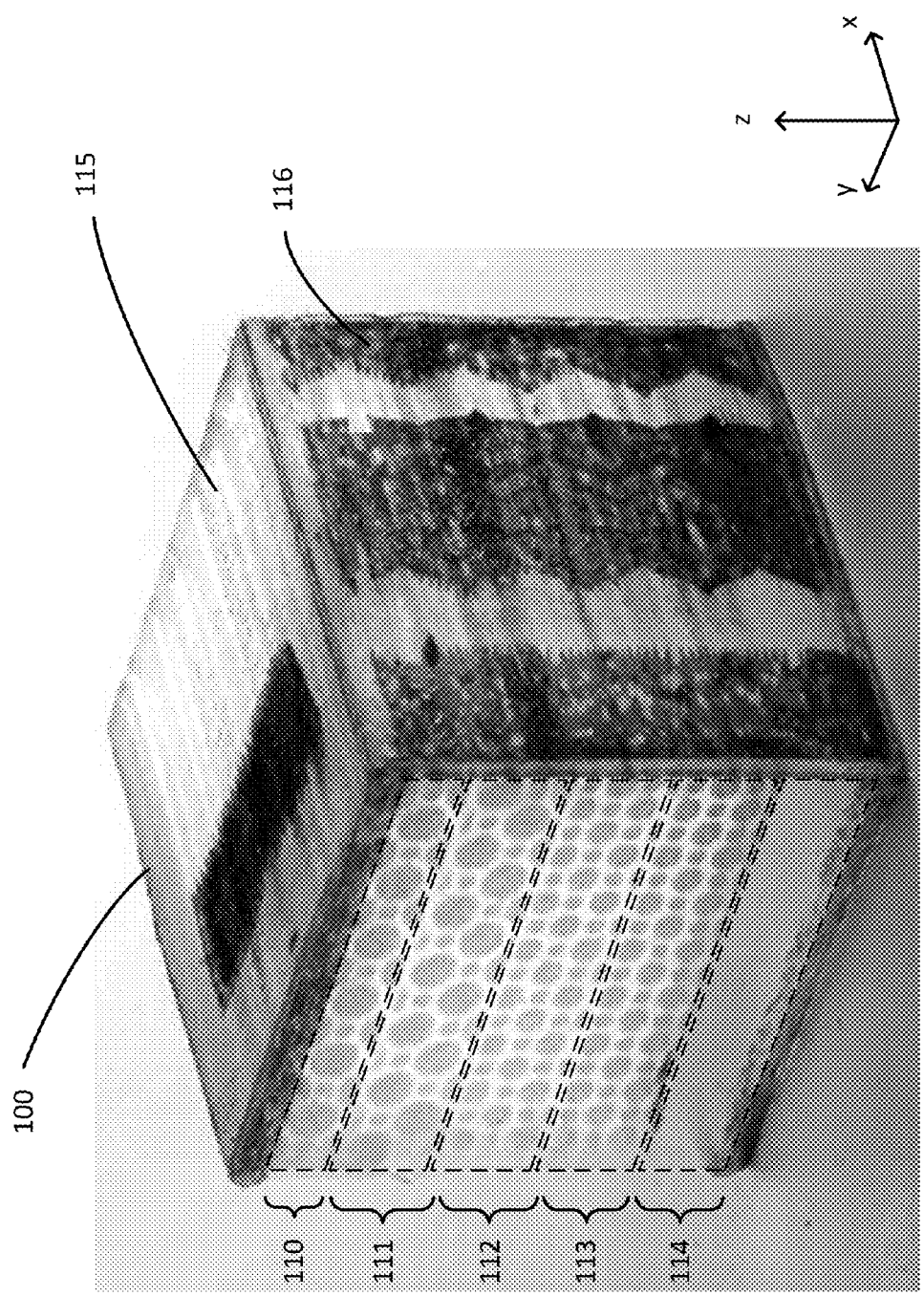
FIG. 1 depicts a photograph of an exemplary fabricated object with particular mechanical and aesthetic properties designed using techniques described herein, according to some embodiments.

Some additive fabrication techniques allow an object to be fabricated from more than one material. In order to instruct an additive fabrication device to fabricate an object from multiple materials, the types of materials may be specified for each part of the object prior to fabrication. For example, a designer of the object may use a software application to specify which regions of the object are to be fabricated from which of the available materials. The object may then be fabricated by depositing the specified material in each region during fabrication.

As the number of materials available for fabrication increases, however, the potential complexity in appearance and/or in mechanical and optical characteristics of fabricated objects dramatically increases. When provided with a desired set of characteristics for a fabricated object, it can be both time consuming and, in some cases, difficult or impossible, for a user to specify which material should be deposited in each region of the object such that the object can be fabricated with the desired characteristics. This is because there is not always a clear intuitive correspondence between a desired characteristic of a fabricated object and the placement or choice of materials that would be required to produce that characteristic.

For example, to design an object using materials having different colors (e.g., to form a picture or texture on the object), a designer of the object may conventionally specify a color for each point of the object (e.g., using a computer aided design software application). As another example, to design an object that compresses a particular way when squeezed, a designer of the object may conventionally specify one or more materials with which to fabricate the object, and where those materials should be located in the fabricated object, so that the fabricated object exhibits the desired compression characteristics. In each case, a designer must consider the desired properties of a fabricated object and then decide how to put materials together so that the combined materials make an object having those desired properties.

In certain cases, however, it may be impossible for a designer to know how to specify the materials such that the fabricated object has desired characteristics. If, for example, the desired way in which a fabricated object compresses when squeezed is complex (e.g., the object is more compressible when squeezed in one region of the object than in another), it may be difficult or impossible for the designer to intuitively decide how to put materials together so that the combined materials exhibit the desired properties. The designer may be forced to fabricate an object and see how it behaves before altering the design and then fabricating a new design.

Alternatively, the designer may attempt to determine a design computationally. For example, an object may be conceptually broken down into volume elements (voxels) and a material identified for each voxel. By determining which material should be chosen for each voxel, a composition for the whole object may be determined. However, for many objects this is a computationally intractable problem. For an object comprising many voxels that can each comprise one of a number of materials, there are a very large number of possible compositions of the object and a correspondingly large number of parameters that are needed to describe a composition. To computationally determine which of these compositions best fits the desired properties of the object may be difficult or impossible due to the large space of parameters that must be searched for the best fit composition.

The inventors have recognized and appreciated that by providing a way to parameterize both how an object is divided into sub-regions and how materials are chosen for the sub-regions, a composition of the object may be determined based on a reduced set of parameters. By adjusting the parameters that determine how the object is divided into sub-regions (e.g., determining their size and/or shape) and how materials are chosen for the sub-regions, the composition may be adjusted. Accordingly, a composition of the object may be determined that would exhibit one or more desired properties of the object by determining the values of the parameters that would result in that composition.

To design an object that exhibits one or more desired properties, a designer of the object may, using the techniques described herein, identify a plurality of sub-regions of the object with sizes and/or shapes described by a first set of parameters. A choice of material for each of the identified sub-regions may be represented by one or more parameters for each of the sub-regions, together forming a second set of parameters. The first and second sets of parameters together therefore completely describe the composition of the object, and the composition may be adjusted by adjusting values of those parameters, for example until a composition of the object that matches (or matches to a suitable degree) the one or more desired properties is identified.

For example, to design an object that compresses a particular way when squeezed, two sub-regions may be identified that represent a surface region of the object and an inner region of the object. The size and shape of the two sub-regions may, in some use cases, be parameterized by one parameter (e.g., a fractional distance from the surface at which the first sub-region ends). The material choice for each of the two sub-regions may, in some use cases, be determined by a single parameter for each sub-region. Accordingly, the composition of the object is now described by three parameters. The three parameters may be optimized for the particular compression behavior that is desired, such as based on one or more properties (e.g., compressibility) of materials from which the object may be fabricated.

In some embodiments, the choice of sub-regions and/or selection of material for each sub-region may be adjusted by simulating the object with the chosen sub-regions and selected materials. By comparing the properties of the simulated object with desired properties of the object, an indication of how to adjust the choice of sub-regions and/or selection of material for sub-regions may be determined. For example, if the object to be designed has a desired density and the simulated object using a first composition has a lower density than is desired, a more dense material may be selected for one or more of the sub-regions to determine a second composition having a higher density than the first composition. The object may be simulated again with the second composition and again compared with the desired density, etc. Type(s) of simulation performed may depend, at least in part, on the desired properties of the designed object. For example, where particular optical properties of the object are desired, an optical (e.g., raytracing) simulation or the like may be performed. Alternatively, or additionally, where particular mechanical properties of the object are desired, a mechanical simulation (e.g., one using finite element analysis) may be performed.

As used herein, choosing a material for a sub-region comprises identifying a chemical substance or substances (and may further include identifying an additive fabrication technique) with which to form that sub-region. Since some additive fabrication techniques may produce one or more regions of a fabricated object having one or more properties (e.g., density, hardness, temperature conductivity) that differ from the chemical substance or substances used to form the region(s), a distinction is made herein between a substance utilized by an additive fabrication system and a material that is formed by the system from that substance. Techniques for designing an object as described herein may compare a simulation of a designed object with one or more desired properties; accordingly, these comparisons are based (at least primarily) on the materials that would be formed in the designed object if it were fabricated. As used herein, therefore, a "material" refers to matter from which at least a portion of a fabricated object is formed, which may or may not have the same properties as one or more substances used to fabricate the at least a portion.

In some embodiments, choosing a material for one or more sub-regions may comprise selecting a material from a list of available materials. For example, an additive fabrication system may be associated with a particular set of materials from which an object can be fabricated (e.g., the materials available to a user and/or materials that the system is capable of using). An object may be designed by selecting a material from this list of materials for the sub-regions of the object when determining a composition. In some embodiments, the list of materials may include one or more materials formed from the same substance but with different coloring agents added. For example, the set of materials may include a first material formed from Acrylonitrile Butadiene Styrene (ABS) and a red pigment, and may also include a second material formed from ABS and a white pigment.

In some embodiments, a choice of a material for a particular sub-region may comprise identifying a material from a set of materials that may each be formed from a single substance. For example, an additive fabrication process may be capable of fabricating a single substance in numerous ways (e.g., by creating layers of varying density from the same substance) and/or may have a capability to produce a range of one or more properties from a substance based on some aspect of the fabrication process (e.g., by adjusting a temperature, a pressure, etc.). In these cases, choosing a material may comprise identifying one of a set of materials that may be fabricated from the substance, such as in order to have a desired property.

In some embodiments, choosing a material for one or more sub-regions may comprise selecting a predetermined material. In some use cases, it may be beneficial to choose a fixed material for one or more sub-regions of an object. In these cases, choosing a material for these one or more sub-regions may simply consist of identifying that material. For example, an object may be designed for which the desired properties include the appearance of the exterior of the object. In some use cases, one or more sub-regions in the bulk of the fabricated object (e.g., sub-regions not close to the surface) may be substantially irrelevant in determining how to design the object with the desired physical properties. In such an exemplary case, a material may be selected from which to fabricate the bulk sub-regions such that the design process does not optimize the material of these sub-regions (though it may still adjust the size and/or shape of the bulk sub-regions). For example, the bulk sub-regions may be fabricated from a cheap material and/or one that is quickly or easily fabricated to increase efficiency of the fabrication process.

In some embodiments, a list of materials from which a material is chosen for one or more sub-regions includes a void material. In most additive fabrication techniques, forming a region of a fabricated object from a void material simply means that no material is deposited in that region. Utilizing a void material may, for example, allow the structure of an object to be determined by identifying sub-regions at the surface (e.g., sub-regions not oriented parallel to the surface) and selecting the void material for those sub-regions. This may cause the fabricated object to have a different physical shape than a geometrical shape from which the fabricated object was designed. In some use cases, selecting a void material for some sub-regions may result in those sub-regions being composed of air (e.g., because the object is fabricated in an air environment and no material was placed in those sub-regions). An example of using a void material in a designed object is described in greater detail below.

In some embodiments, one or more physical properties of a material used to determine a composition of an object may be known and provided as an input to the design process. In some use cases, physical properties that could have an impact on desired properties of the designed object may be provided as inputs. For example, where the desired properties include only optical properties, the index of refraction of each material may be provided as input, whereas other properties of the materials may not substantially affect the desired optical properties of the designed object and may not be provided as inputs. However, in general any number of physical properties may be specified as inputs for each of the materials used in a design of an object.

As discussed above, the inventors have recognized and appreciated that determination of the composition of an object having desired properties may be simplified by adjusting both the way in which the object is conceptually broken down into sub-regions and how a material is identified for those sub-regions. In some embodiments, a set of parameters described by a reducer tree, which control how the object is conceptually broken down into sub-regions and how a material is identified for those sub-regions, are adjusted. A reducer tree, described in greater detail below, is a sequence of operations that allows both the identification of sub-regions of an object and the materials chosen for the sub-regions to be parameterized. Determining the composition of an object is thereby reduced to choosing values for the parameters described by the reducer tree. A reducer tree may be configured to determine a composition using fewer parameters than would be used when breaking the object into voxels, as described above, thereby presenting a simpler computational problem in comparison.

In some embodiments, a reducer tree is described as a plurality of nodes in a tree structure, wherein a node either performs an operation of identifying sub-regions of an object or of selecting a material for one or more identified sub-regions. Describing a reducer tree in this way may provide a mechanism to adjust only a subset of the nodes when determining a composition for an object, which may further reduce the number of parameters to be optimized when determining the composition. A reducer tree may comprise one or more parameters, of which one or more parameters may be free (e.g., adjustable) and zero or more may be fixed. Together, the parameters determine a composition of an shape input to the reducer tree. The composition may be adjusted by optimizing one or more free parameters of the reducer tree.

In some embodiments, a reducer tree may be configured to be particularly applicable for a particular set of use cases. Since certain desired properties of a designed object may have implications for certain regions of the object, it may be beneficial for a reducer tree to be configured to primarily optimize for those regions. For example, where the desired properties include only the surface appearance (e.g., a texture and/or color) of the object, materials chosen for the interior of the object may be less relevant than those chosen for the surface region of the object. Therefore, in this use case, a reducer tree configured to choose a single material for the interior of the object but to provide many adjustable sub-regions at the surface of the object may be particularly suited to determine a composition for this use case. In practice, therefore, a developer may create a reducer tree applicable for a particular use case, which may then be used (by the developer or by another user) to generate a design for an object. This may allow a user to design an object by providing only an input geometry (e.g., representing a shape of the object to be designed) and one or more desired properties to a reducer tree, without needing to design the reducer tree itself.

As discussed above, a choice of sub-regions and/or selection of material for each sub-region may be adjusted by simulating the object with the chosen sub-regions and selected materials. In some embodiments, one or more optimization techniques are used to determine how to adjust the choice of sub-regions and/or selection of material for the sub-regions in order to produce a new composition with properties closer to the desired properties of the object. For example, based on a metric indicative of how similar the simulated properties are to desired properties, the choice of sub-regions and/or selection of material for each sub-region may be modified. In some embodiments, one or more parameters of a reducer tree are optimized based a measure of similarity between simulated properties and desired properties.

In some embodiments, one or more networks of optimizers, or "tuners," are used to optimize parameters of a reducer tree. A tuner network may be comprised of one or more tuners. Where a tuner network comprises more than one tuner, its constituent tuners may share at least some information with one or more other tuners in the network during optimization of parameters of a reducer tree. Alternatively, or additionally, a tuner may be configured to tune only a subset of the parameters of a reducer tree, which may allow the tuners to perform optimization in parallel, thus increasing the efficiency of the optimization process. For example, one or more tuners in a first tuner network may be configured to optimize a first set of parameters associated with a reducer tree and one or more tuners in a second tuner network may be configured to optimize a second set of parameters associated with the reducer tree.

Following below are more detailed descriptions of various concepts related to, and embodiments of, generating a design of an object based on one or more desired properties of the object. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1 depicts a photograph of an exemplary fabricated object with particular mechanical and aesthetic properties designed using techniques described herein, according to some embodiments. In the example of FIG. 1, desired properties of an object to be fabricated include the compressibility of the object in a vertical direction (z-direction) when under load in that direction, and an exterior appearance that approximates that of a book.

Object 100 is an object fabricated using one or more additive fabrication techniques and whose composition was determined using the techniques described herein. As discussed above, a design of an object, which includes a determination of a composition, may be generated based on one or more desired properties and an indication of the shape of the object. In the example of FIG. 1, a cuboid was provided as a representation of the shape and the desired properties included both mechanical and aesthetic properties.

In the example of FIG. 1, object 100 was designed based in part on a desired behavior when the object is subjected to a load in the negative-z direction (directional axes are shown in the bottom-right of the figure). In particular, the desired behavior is that the object deform an amount that depends upon the magnitude of the applied load. Thus, when a load (e.g., a force) is applied to the object in the negative-z direction (downwards as shown in FIG. 1), the object deforms in that direction an amount that depends on the magnitude of the load. In some embodiments, design of object may be based on a desired deformed shape (e.g., provided as a three-dimensional model to the design process).

As FIG. 1 is provided merely to depict an exemplary object, the precise mathematical description of the desired deformation behavior is not shown in the figure, nor described herein, but rather only a qualitative description is provided to explain in broad terms how the techniques described herein may be utilized to design an object similar to that shown in FIG. 1. Nonetheless, when practicing the methods described herein, a mathematical description of the precise deformation behavior of the object to be designed may be provided as input to the design process.

In the example of FIG. 1, object 100 was further designed based in part on a desired appearance. In particular, object 100 was designed such that the exterior of the object has an appearance of a book. For example, object 100 may have been designed using one or more images (e.g., one or more JPEG images) as a target appearance and the object designed to match and/or approximate the image(s).

As discussed above, a composition of an object having desired properties may be determined by identifying a plurality of sub-regions of the object and selecting a material for one or more of those sub-regions. In the example of FIG. 1, the techniques described herein resulted in the identification of the following sub-regions: first, a plurality of sub-regions in a surface layer of the object; and second, five sub-regions in the bulk of the object. The surface sub-regions may allow the appearance of the object (i.e., that of a book) to be provided by choosing suitable materials for those surface sub-regions, while the bulk sub-regions may allow the desired mechanical properties (the deformation behavior described above) to be provided by choosing materials with suitable mechanical properties.

In the example of FIG. 1, sub-regions 110-114 were identified in the bulk of object 100 and materials were identified for those sub-regions based on the desired mechanical properties. The five identified materials from 110-114 have a decreasing compressibility, with the material in sub-region 110 having the highest compressibility, the material in sub-region 114 having the lowest compressibility and the materials in sub-regions 111, 112 and 113 having compressibility that decreases from one sub-region to the next in that order. Sub-regions 110-114 were formed from substances having substantially the same chemical structure, but were formed in such a way as to result in sub-regions with different mechanical properties (as can be seen by the varying size of the internal structures in the sub-regions). While such substances may be provided to an additive fabrication process in the same form, since they can be formed in a plurality of ways during fabrication, as discussed above they are referred to herein as being different materials for the purposes of choosing a material for a sub-region of an object.

In the example of FIG. 1, a plurality of sub-regions at the surface of the object were identified and materials identified based on the desired appearance of the object, of which sub-regions 115 and 116 are identified as examples. In some use cases, the object may be broken down into sub-regions at the surface of the object that are substantially the size of a pixel of an image. Since a pixel represents the highest level of detail of an image, sub-regions of a corresponding size may represent an optimal size for those sub-regions. For example, if the cover of the book is represented by a 100×100 pixel image, it may be beneficial for a design to be based on 10,000 regularly spaced sub-regions across the surface of the object representing the cover of the book. A material may be selected for each sub-region based on a color, brightness, saturation, or combinations thereof, of a corresponding pixel.

Figure 2:
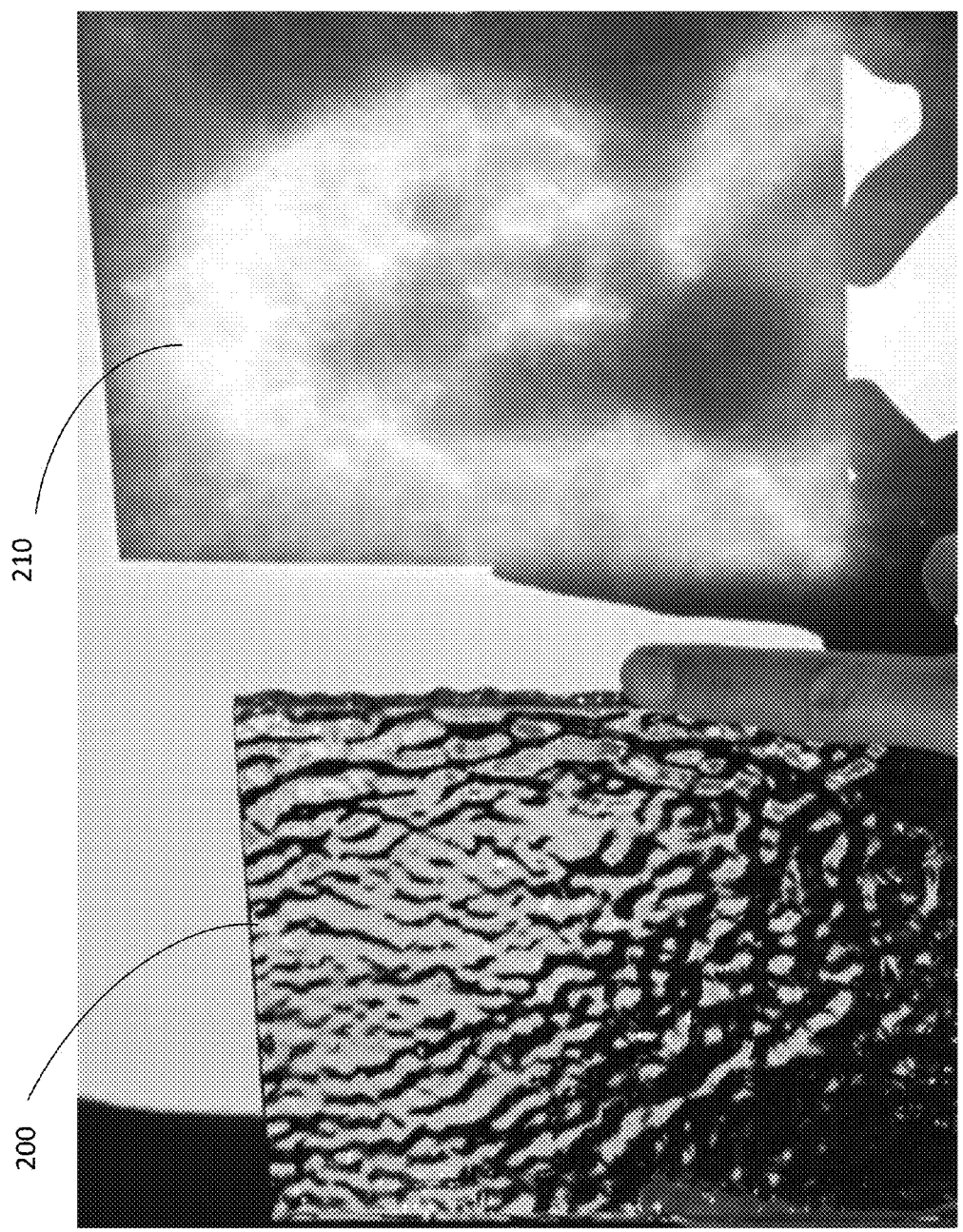
FIG. 2 depicts a photograph of an exemplary fabricated object with particular optical properties designed using techniques described herein, according to some embodiments.

FIG. 2 depicts a photograph of an exemplary fabricated object with particular optical properties designed using techniques described herein, according to some embodiments. Exemplary fabricated object 200 has an optical property that light passing through it projects an image of Albert Einstein onto a surface 210. As discussed above, determination of a composition of an object by choosing from a plurality of materials may include a void material. In the example of FIG. 2, a thin cuboid was provided as a representation of the object to be designed and the image of Einstein as a result of light passing through the object was provided as a target property. The designed object has a composition that includes a material having an index of refraction greater than that of air in a first sub-region, and includes a void material (e.g., air) in a second sub-region. When the designed object is fabricated, the material in the first sub-region is fabricated and a void is left in the second sub-region, resulting in the object having a surface structure as shown in FIG. 2.

Figure 3:
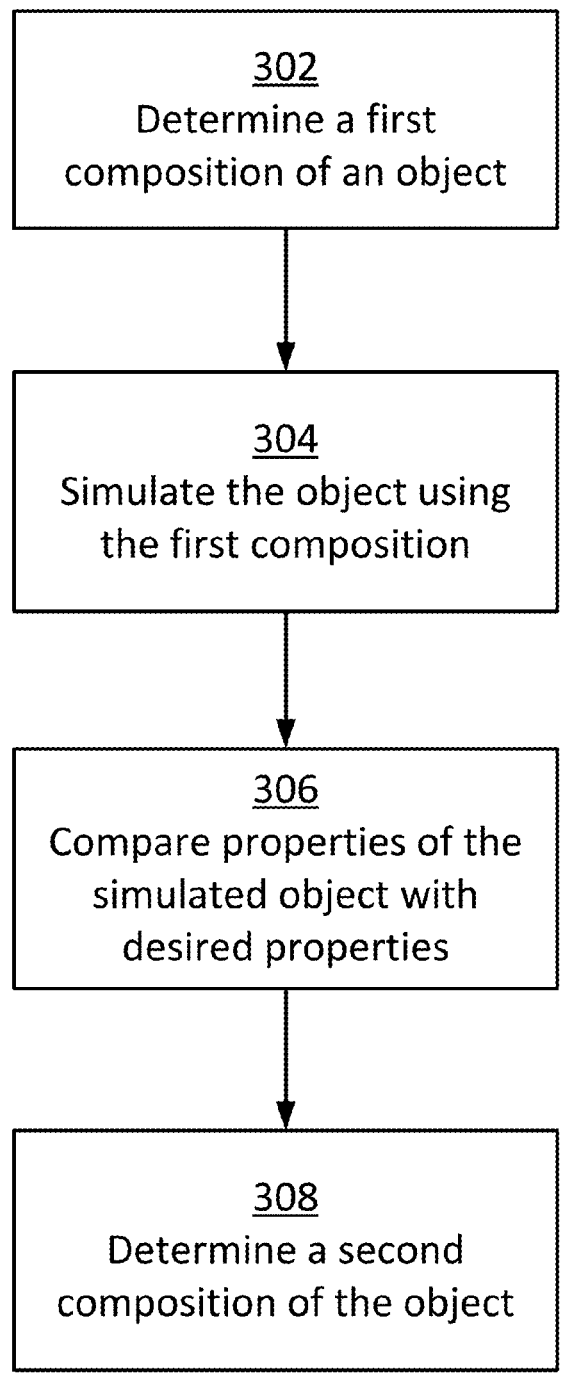
FIG. 3 depicts a method of generating a design of an object based on one or more desired properties of the object, according to some embodiments.
Figure 8:
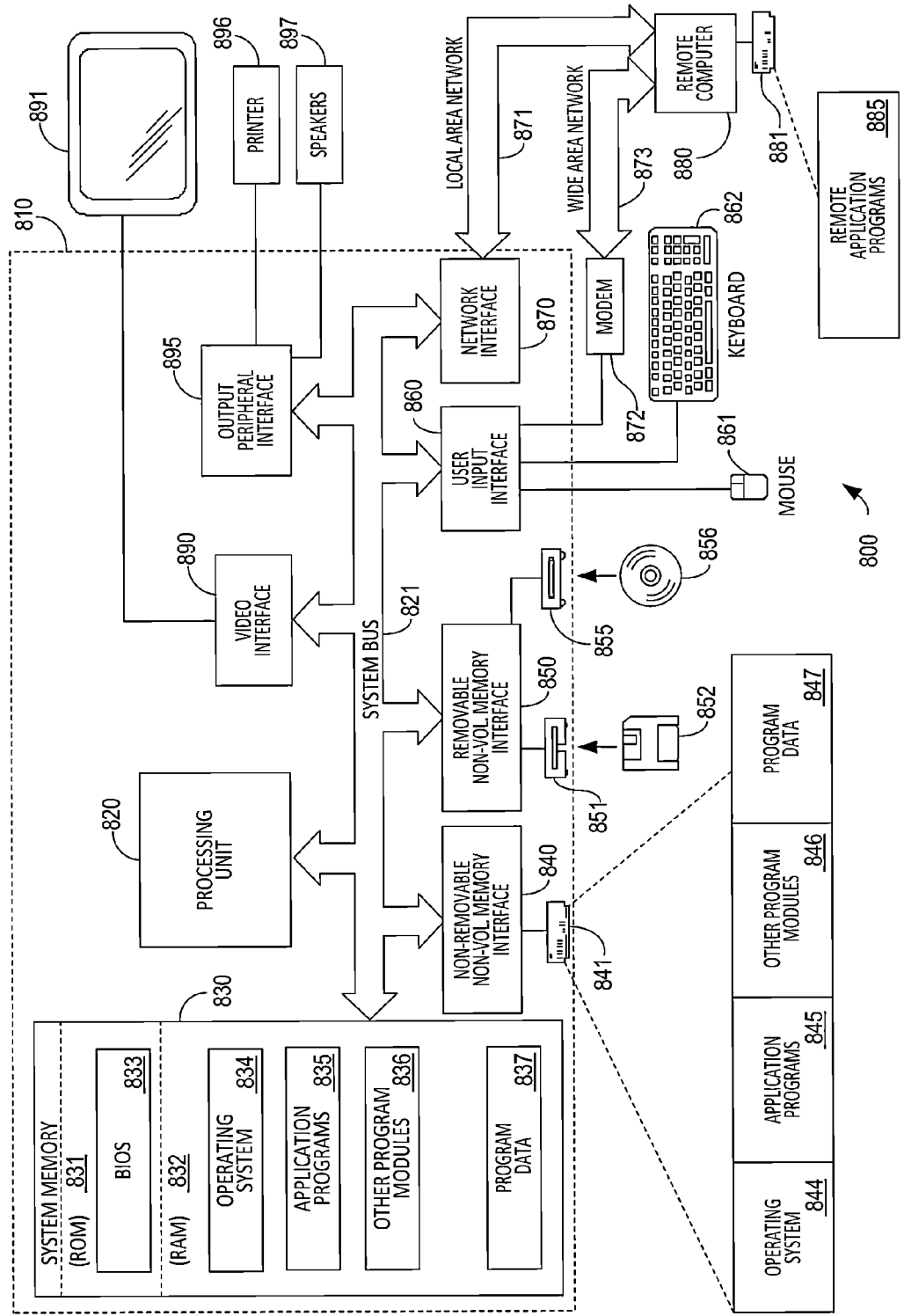
FIG. 8 illustrates an example of a computing system environment on which aspects of the invention may be implemented.

FIG. 3 depicts a method for generating a design of an object based on one or more desired properties of the object, according to some embodiments. Method 300 may be performed by one or more suitable apparatuses, an example of which is shown in FIG. 8 below. Method 300 determines a first composition of an object in act 302, and in acts 304 and 306 simulates the object using the first composition and compares one or more properties of the simulated object with one or more target properties. In act 308, method 300 determines a second composition based on a result of the comparison. In order to design an object, multiple simulations may, in some use cases, be performed before a composition is determined that has one or more properties suitably close to the target properties. As such, in some use cases, method 300 may represent only a portion of the design process. For example, a design process may include steps of determining a composition of an object, and then simulating the object with the composition and adjusting the composition based on the simulation any number of times before a final composition is identified.

In act 302, a first composition of an object is determined. As discussed above, a composition of an object may be determined by identifying a plurality of sub-regions of an input geometry, such as a three-dimensional model (e.g., a model chosen to represent the shape of the object to be designed) and by selecting a material for the sub-regions. The sub-regions may be determined in any suitable way. In some embodiments, one or more geometrical operations are performed on the model or to a sub-region of the model, each of which subdivide the model or subdivide a sub-region of the model, respectively, into a plurality of sub-regions. As used herein, "subdividing" comprises identifying sub-regions within a volume, which may be a model or a sub-region. A first sub-region may thereby be subdivided to produce one or more new sub-regions (and the first sub-region is no longer identified as a sub-region). A result of a subdivision operation (e.g., data describing a plurality of sub-regions) may be stored in any suitable way, and may or may not comprise a modification of the three-dimensional model. For example, sub-regions identified from a model may be themselves stored as separate models, and/or may be stored as a plurality of mathematical operations that, when applied to a model, will identify the sub-regions. Sub-regions identified by a subdivision may be of any suitable size and/or shape, and may or may not have identical sizes and/or shapes.

As an exemplary process of identifying sub-regions, a first geometrical operation may subdivide a three-dimensional model of a cube into two sub-regions of equal size by subdividing the model through the center of opposing faces of the cube. A second geometrical operation may then subdivide one of the two sub-regions into a plurality of smaller, cubic sub-regions of equal size. The identified sub-regions therefore consist of a single sub-region in one half of the cube and the plurality of smaller sub-regions filling the other half of the cube. This process is provided merely as an example, however, and in general any number of any type of geometrical operations may be performed upon any suitable region of a model.

Determining the first composition of an object in act 302 may further comprise choosing a material for the identified sub-regions. As discussed above, choosing a material for a sub-region may comprise selecting a material from a list of materials, may comprise identifying how to fabricate the material from a particular substance or substances and/or may comprise selecting a predetermined fixed material. In determining the first composition of the object, a material for a given sub-region may be determined using one or more of these approaches and/or using any other suitable approach.

In some embodiments, determination of the first composition in act 302 may comprise providing a three-dimensional model to a reducer tree. As described above, a reducer tree may, based on a set of parameters, identify a plurality of sub-regions of a model and may choose a material for the identified sub-regions. The reducer tree may use any suitable values of these parameters, and may utilize any suitable set of parameters, examples of which are discussed below. In some embodiments, the reducer tree performs one or more geometrical operations, as discussed above, to identify sub-regions of the model.

In act 304, the object with the first composition is simulated. Any type and any number of simulations may be performed such that one or more physical properties of the simulated properties may be determined. Any number of physical properties of the object with the first composition may be determined in act 304. At least a portion of these physical properties may be associated with one or more desired physical properties of the designed object. Examples of the types of simulations that may be performed in act 304 include, but are not limited to, mechanical, structural, fluid flow, air flow, thermal, optical (e.g., raytracing), acoustic, or combinations thereof.

In some embodiments, in act 304 one or more simulations are performed that determine one or more mechanical properties of the object with the first composition. For example, such properties may include, but are not limited to, one or more of density, thickness, Young's modulus, hardness, shear modulus, Poisson's ratio, compressive strength, plasticity, tensile strength, coefficient of friction, flexural strength, resilience and/or coefficient of thermal expansion. Any number of any type of simulations may be performed to determine any number of mechanical properties, including but not limited to those listed above. A simulation may, for example, comprise one or more finite element analyses (e.g., using the direct stiffness method, etc.).

In some embodiments, in act 304 one or more simulations are performed that determine one or more optical properties of the object with the first composition. Any simulation that identifies the object's response to light may be performed in act 304 (along with any other type of simulation or simulations). For example, any suitable raytracing and/or raycasting algorithm(s) may be applied to the object with the first composition to determine one or more aspects of how the object responds to light.

As a non-limiting example, an optical simulation may be performed to determine the refractive properties of an object with the first composition. As shown above in FIG. 2, an object may be designed that produces an image when light passes through it. An optical simulation may be performed to determine the image that results when light passes through the object with the first composition (and may be subsequently compared with an image representing a desired property of the object in act 306, described below).

In some embodiments, in act 304 one or more simulations are performed that determine one or more acoustic properties of the object with the first composition. In some use cases, a resonance frequency of one or more parts of an object may depend upon the material composition of these and/or other parts of the object. By simulating the object's response to acoustic vibrations (e.g., sound waves), an acoustic response of the object may be determined for the first composition.

Irrespective of the type of simulation(s) performed in act 304, in some embodiments the one or more physical properties determined in act 304 (e.g., mechanic, optical, acoustic, etc.) may be determined based at least in part on one or more desired properties of the designed object. For example, in some use cases the desired properties may be optical in nature, and it may or may not be beneficial to perform a mechanical simulation based on the nature of the desired properties. Alternatively, or additionally, in some use cases the desired properties may be limited to a particular property, such as a density. In these cases, while a single simulation may be capable of determining this property in addition to other properties, it may be beneficial to only determine those properties that have a bearing on the desired properties to reduce processing time during design of the object. For example, if the desired property includes only the density of an object, while a single simulation might be capable of determining both density and Young's modulus, it may be beneficial in some use cases to only determine density to reduce processing time.

In act 306, one or more of the physical properties determined from the simulation(s) in act 304 may be compared with one or more desired properties of the designed object. Any suitable process that determines a quantitative measure of a difference between one or more of the physical properties determined from the simulation(s) and the one or more desired properties may be used. In some embodiments, a comparison of one or more of the physical properties determined from the simulation in act 304 with one or more desired properties of the designed object comprises determining a metric that represents a deviation of the one or more physical properties from the one or more desired properties.

In act 308, a second composition of the object is determined. In some embodiments, an optimization function configured to describe a parameterization of the identification of sub-regions and the selection of materials for the sub-regions (e.g., a reducer tree) is optimized to determine a second composition. For example, the parameters may be described by an optimization function, which may be optimized using an optimization technique (e.g., simulated annealing, Monte-Carlo sampling, interval methods, Bayesian optimization, etc.) and a metric determined in act 306. However, in general any technique(s) to determine a second composition based on a result of the comparison in act 306 may be used as method 300 is not limited in this aspect.

Figure 4:
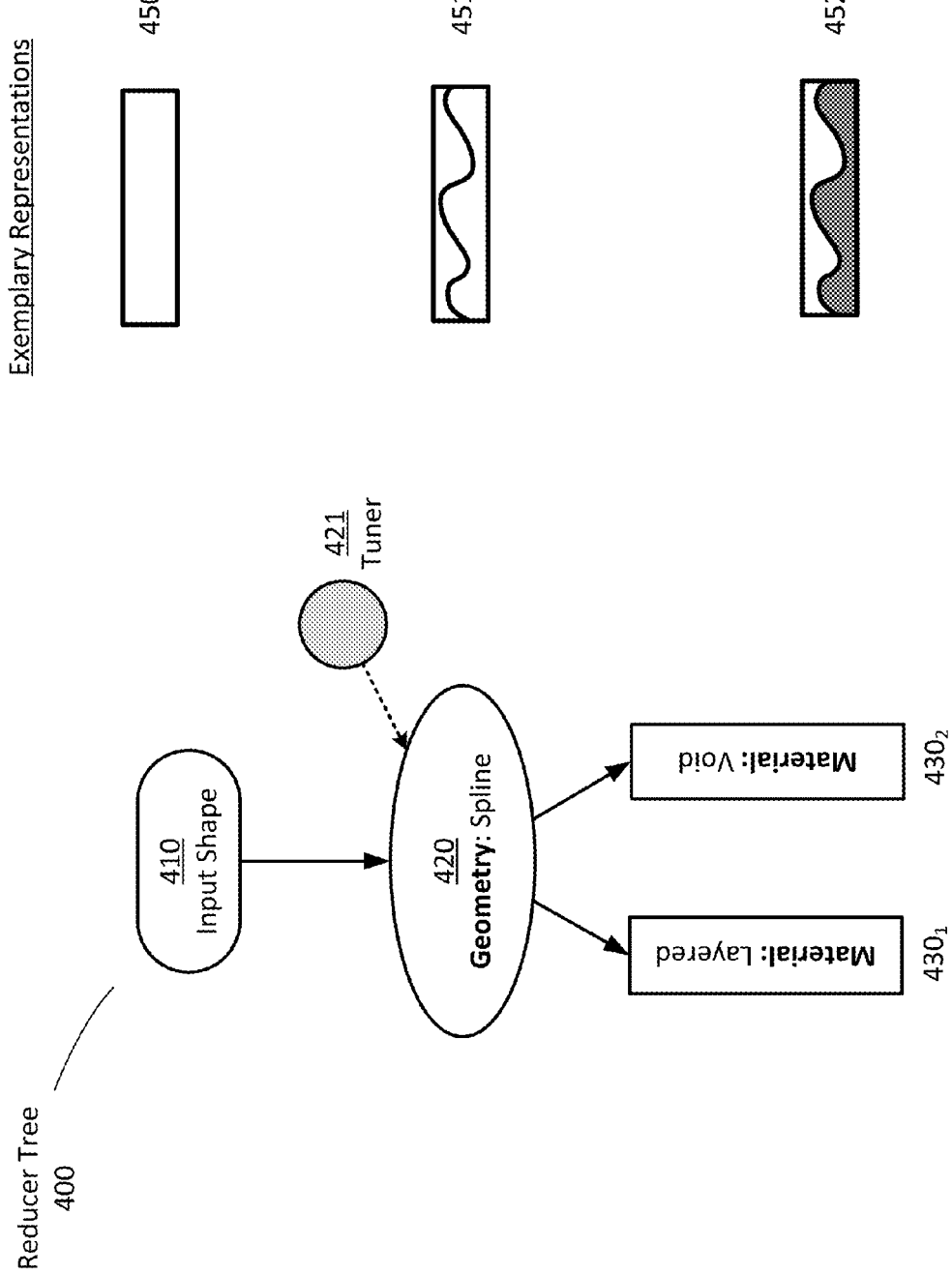
FIG. 4 depicts an exemplary reducer tree configured for smooth caustics applications, according to some embodiments.

FIG. 4 depicts an exemplary reducer tree configured for smooth caustics applications, according to some embodiments. As discussed above, a reducer tree parameterizes both the identification of sub-regions of an object and the selection of materials for those sub-regions. The exemplary reducer tree 400 shown in FIG. 4 may be particularly applicable to use cases in which a caustic—the envelope of light rays that are reflected and/or refracted from a curved surface or object—is an aspect of desired properties of a designed object. For example, reducer tree 400 may be optimized to produce object 200 shown in FIG. 2 in which a caustic that forms an image of Einstein is produced by the object. However, as discussed above, while a reducer tree may have particular applicability to one or more particular use cases, it may have further use in other use cases as well.

Reducer tree 400 includes an input 410, in which a shape (e.g., a three-dimensional shape) is supplied as input, and three nodes 420, $430_1$ and $430_2$. Node 420 is a geometry node which performs one or more subdivisions of an input volume and nodes $430_1$ and $430_2$ are material nodes which select a material for sub-regions provided as input. In the example of FIG. 4, geometry node 420 performs a subdivision based on a spline, separating an input shape into two regions along the spline.

In the example of FIG. 4, exemplary representations 450-452 are shown alongside input 410, node 420 and nodes $430_1$-$430_2$ respectively, to give an example of how each node performs subdivisions and/or identifies a material of an input shape. The exemplary representations 450-452 in FIG. 4 are based on an input shape that is a cuboid, however a reducer tree performs operations on an input shape irrespective of what that shape is, and accordingly the cuboid shape input depicted in FIG. 4 is merely one example of how reducer 400 might identify a composition of an input shape.

The spline used to perform a subdivision by geometry node 420 may be described by any number of parameters, which may depend upon the type of spline used. The type of spline may be of any suitable type (e.g., B-spline, Bezier spline, etc.) and may be of any suitable order (e.g., 2, 3, etc.). In some embodiments, a geometry node based on a spline operation parameterizes a position of a plurality of points and determines a surface spline by interpolating between those points. For example, each of a plurality of points may be in a regularly spaced grid shape, and may be parameterized by a height parameter, thereby parameterizing the surface spline using a single parameter for each point. However, in general any suitable parameterization may be used to define the subdivide performed by a geometry node based on a spline.

As shown in exemplary representation 451, the input shape 450 is separated into two sub-regions by the geometry node 420 based on a spline. It will be appreciated that exemplary representation 451 may represent a single cross-section through a three-dimensional shape and that a different cross-section through this exemplary shape may accordingly exhibit a different two-dimensional spline than shown in FIG. 4, since the surface splice may have a shape that varies through the shape.

In the example of FIG. 4, a tuner 421 is associated with geometry node 420. As discussed above, one or more tuners may be associated a reducer tree that perform optimization of parameters of the reducer tree. In some embodiments, a tuner may optimize parameters situated at an associated node of a reducer tree, and may further optimize one or more nodes below that node in the reducer tree. In the example of FIG. 4, tuner 421 is configured to optimize reducer tree 400 by optimizing parameters of geometry node 420 in addition to parameters of material nodes $430_1$ and $430_2$. Further details on how a tuner optimizes parameters of a reduced tree is discussed below in relation to FIG. 7.

In some embodiments, a tuner such as tuner 421 optimizes one or more parameters of a reducer tree by simulating an object described by the reducer tree using a first values of the one or more parameters and comparing one or more properties of the object resulting from the simulation with one or more desired properties. Second values of the one or more parameters of the reducer tree may then be chosen to optimize the object described by the reducer tree in relation to the one or more desired properties. One or more parameters of reducer tree 400 could, for example, be optimized to produce an object that produces a caustic having one or more particular properties (e.g., such as the Einstein picture used to produce the object shown in FIG. 2).

As described herein, a tuner is not considered a component of a reducer tree, but is configured to interface with a reducer tree. As discussed above, a tuner may be part of a tuner network; for example, exemplary tuner 421 may be part of a tuner network having a single node. A reducer tree may be configured separately from a tuner network, and accordingly reducer tree 400 could in general be used with one or more tuner networks each having one or more tuners associated with any number of nodes in the reducer tree. However, in the example of FIG. 4, a single tuner is used and is associated with node 420 in reducer tree 400.

Nodes $430_1$ and $430_2$ are material nodes which identify one or more materials for sub-regions determined by parent node 420. In the example of FIG. 4, material node $430_2$ is configured to identify a void material (e.g., air) for one of the sub-regions identified by node 420, and material node $430_1$ is configured to identify a layered material for the other sub-region identified by node 420. A layered material node, such as node $430_1$, is a material node that assigns k layers of material of varying thickness to an identified sub-region. For example, the parameters of a layered material node may include k, the number of layers, a parameter for each layer indicating the thickness of the layer, and a parameter for each layer indicating the material selected for the layer. Any one or more of these parameters may be fixed in the reducer tree, or may be optimized by one or more tuners. In the example of FIG. 4, layered material node $430_1$ is fixed to provide a single material in a single layer to the sub-region, and accordingly has no free parameters (i.e., parameters that may be optimized). The free parameters in reducer tree 400 are accordingly only the parameters that describe the form of the spline used in node 420.

It will be appreciated that a layered material node is equivalent to subdividing a sub-region into further sub-regions and determining a material for each of those sub-regions. However, it may be beneficial in some use cases to use a layered material node as described above as a short-hand way to select materials for a sub-region as a general case. As indicated above, a layered material node that has parameters fixed to use a single layer and a single material has no free parameters. Similarly, a layered material node might have parameters fixed to use a single layer but select from one or more materials for that layer; such a node would have a single free parameter.

As shown in exemplary representation 452, the lower pictured sub-region has a material selected by node $430_1$ and the upper pictured sub-region has a void material (e.g., air) selected by node $430_2$. As discussed above, the result of the reducer tree may describe a designed object similar to that shown in FIG. 2, where the shape of the surface is determined such that a desired caustic is produced.

It may be noted that reducer tree 400 is not configured to receive any particular shape as an input, and may be used with any suitable shape such as, but not limited to, a disc, a lenticular shape, a torus, a cylinder, a rectangular prism, a cone, a tetrahedron, etc. Furthermore, reducer tree 400 is not configured for use with any particular materials or additive fabrication technologies. While a material is selected by node $430_1$, this material can be provided as an input by a user who utilizes reducer tree 400 to determine a design of an object. For example, a user may provide a shape, a material (e.g., one selected based on the user's additive fabrication system) and a desired property as inputs to reducer tree 400, and may use the reducer tree and tuner 421 to determine a design of the object based on the inputs. Reducer tree 400 may accordingly be suitable for use with many possible input shapes, many possible desired properties of a designed object, and/or may different additive fabrication techniques, devices and/or materials.

Figure 5A:
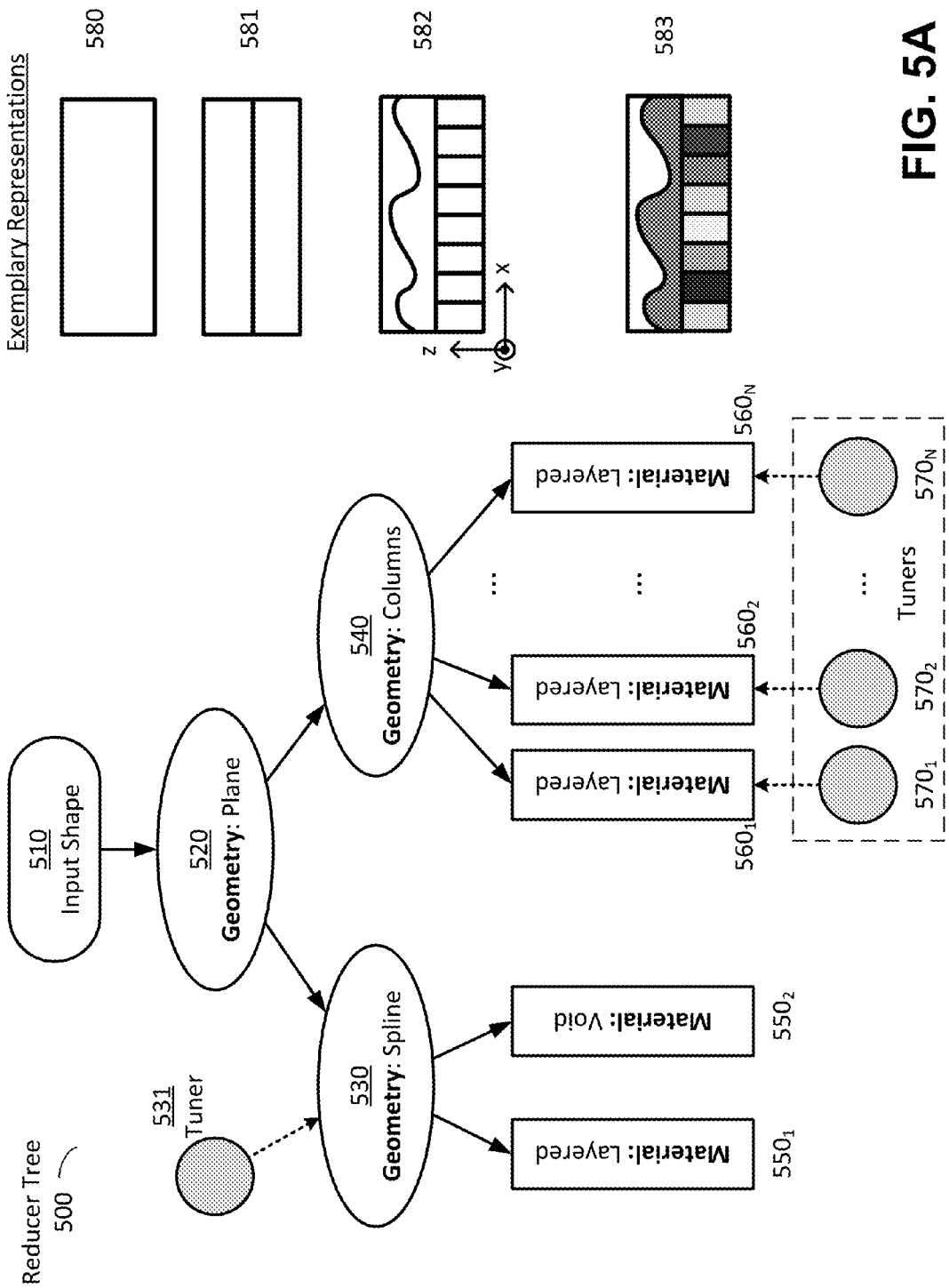
FIG. 5A depicts an exemplary reducer tree configured for smooth caustics and texture applications, according to some embodiments.
Figure 5B:
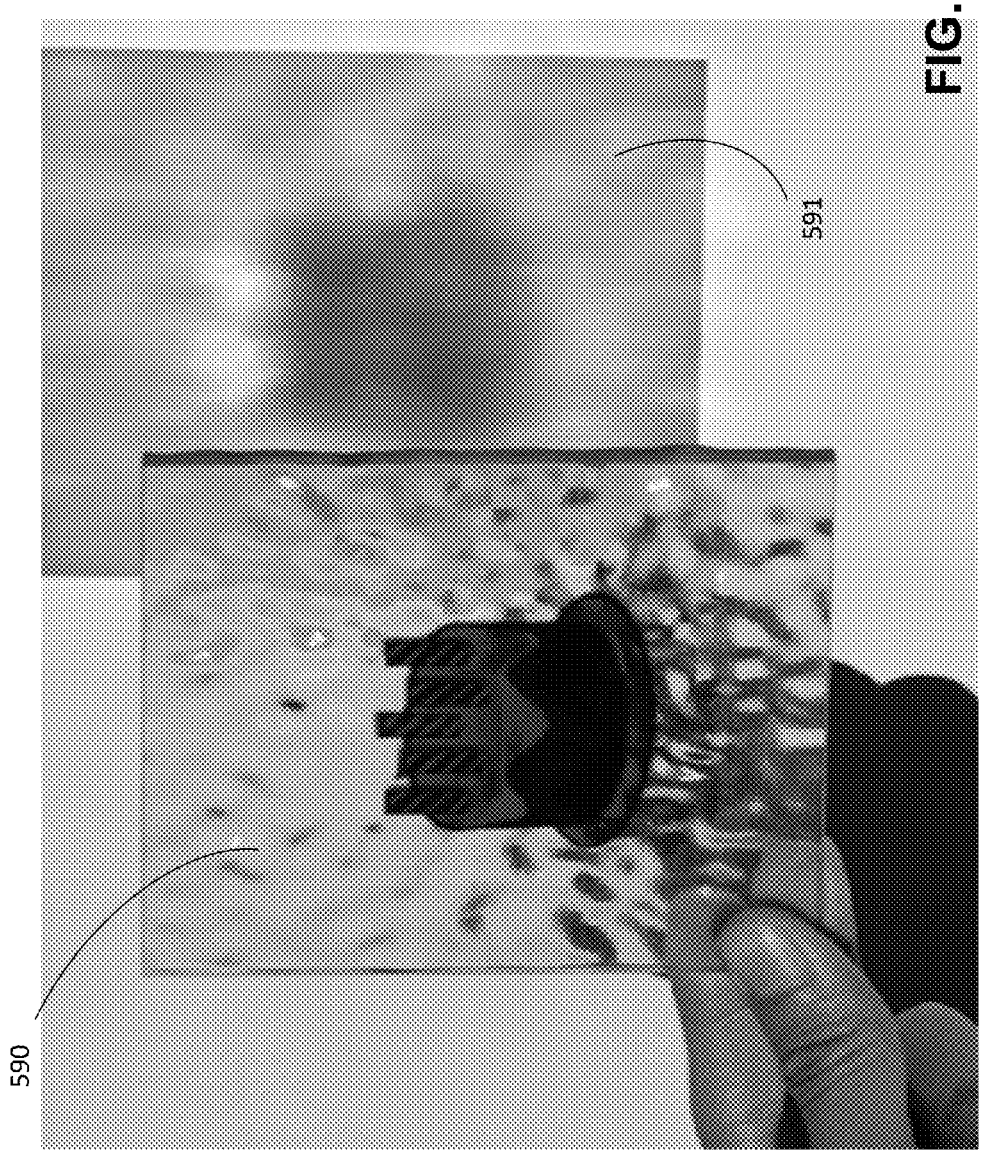
FIG. 5B depicts a photograph of an exemplary fabricated object with smooth caustics and texture properties, according to some embodiments.

FIG. 5A depicts an exemplary reducer tree configured for smooth caustics and texture applications, according to some embodiments. Reducer tree 500 includes geometry nodes 520, 530 and 540, material nodes $550_1$ and $550_2$, and material nodes $560_1$ to $560_N$. The exemplary reducer tree 500 shown in FIG. 5A may be particularly applicable to use cases in which a caustic—the envelope of light rays that are reflected and/or refracted from a curved surface or object—is an aspect of desired properties of a designed object in addition to a surface appearance (e.g., a texture). For example, reducer tree 500 may be used to produce a semi-transparent or semi-translucent object on which a pattern or picture appears that additionally produces a caustic having a desired form. An example of such an object is shown in FIG. 5B. Object 590 includes a picture of a birthday cake with unlit candles and produces a caustic that has the form of a cake with lit candles, as shown by exemplary image 591.

Irrespective of the particular object being designed, in the example of FIG. 5A geometry node 520 subdivides input shape 510 into two equal sub-regions by subdividing along a plane. In general, a geometry node may be configured to subdivide along a plane into unequal sub-regions, but in the example of FIG. 5A node 520 is configured to subdivide a volume into equal sub-regions. A first of the two sub-regions is provided to geometry node 530 and the second to geometry node 540. Geometry node 530 and material nodes $550_1$ and $550_2$ are configured identically in the example of FIG. 5A to geometry node 420 and material nodes $430_1$ and $430_2$, respectively, in the example of FIG. 4. Geometry node 530 subdivides the sub-region provided by geometry node 520. Tuner 531 is configured to optimize parameters associated with a surface spline used by geometry node 530 to subdivide the first sub-region. As discussed above, a tuner node may be part of a tuner network that together optimize one or more parameters of a reducer tree.

Geometry node 540 subdivides the second sub-region provided by node 520 into columns. Exemplary geometry node 540 is configured to subdivide an input volume into a plurality of equally sized columns using a number of columns as a parameter (the size of each column is therefore determined based on the size of the volume and the number of columns to be identified). Exemplary representation 582 depicts an input shape subdivided by geometry nodes 520, 530 and 540. An upper region of the shape has been subdivided by a surface spline shape, and a lower region has been subdivided into columns. It will be appreciated that geometry node 540 is configured to subdivide a volume into sub-regions that appear as columns in a two-dimensional representation as shown by exemplary representation 582, but that the subdivision is performed along two axes of the volume. In some use cases, the sub-regions produced by a column subdivision may have equal size in x and y directions but extend through the entire volume in the z direction (where exemplary representation 582 includes an indication of the x and z directions; the y direction points into the page). As such, the sub-region subdivided into columns by geometry node 540 may appear as a plurality of squares when viewed along the z-axis.

Material nodes $560_1$ to $560_N$ are configured to select a material for each of the N sub-regions identified by geometry node 540 (i.e., N is the number of columns produced by that node). Each of material nodes $560_1$ to $560_N$ is configured to determine a layered material for the column as described above in relation to material node $430_1$. In the example of FIG. 5A, the N sub-regions are designed to be formed from a single material and accordingly each of the sub-regions is parameterized by a single parameter that indicates which of the materials is chosen for that sub-region. Tuners $570_1$ to $570_N$ are configured to each be associated with one of the material nodes $560_1$ to $560_N$ and to optimize the parameter selecting the material of each of the sub-regions.

In the example of FIG. 5A, tuners $570_1$ to $570_N$ are part of a first tuner network and tuner 531 is part of a second tuner network. Each of tuners $570_1$ to $570_N$ may accordingly share information with one or more of the other tuners in the network (e.g., according to a user-specified graph structure). Since an optimal material choice for one of material nodes $560_1$ to $560_N$ may depend, at least in part, on the choice of other nodes in the group of nodes $560_1$ to $560_N$, the associated tuners sharing information with one another may improve optimization of the parameters associated with material nodes $560_1$ to $560_N$ with respect to desired properties of an object being designed.

Figure 6:
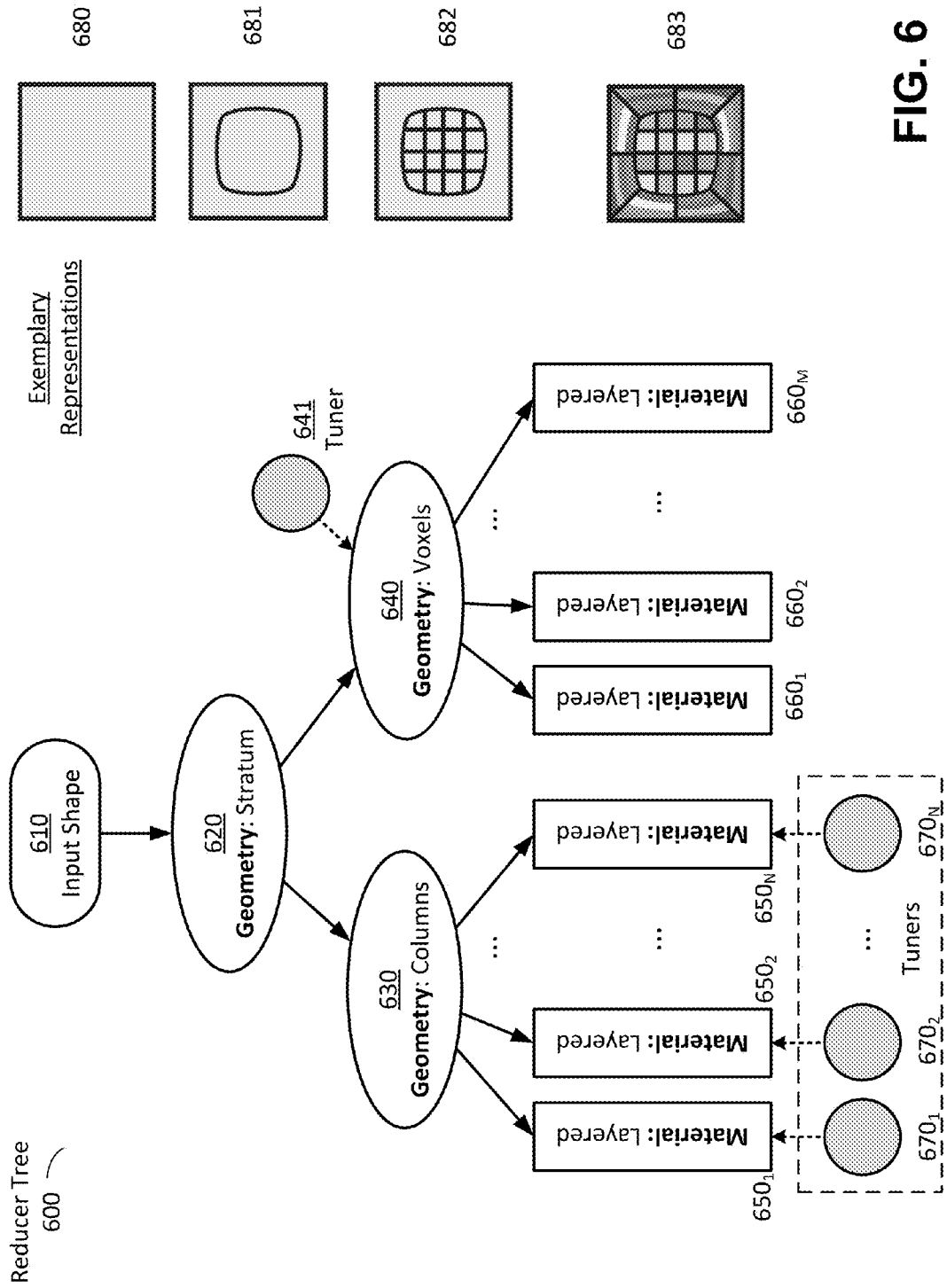
FIG. 6 depicts an exemplary reducer tree configured for mechanical and texture applications, according to some embodiments.

FIG. 6 depicts an exemplary reducer tree configured for mechanical and texture applications, according to some embodiments. Reducer tree 600 includes geometry nodes 620, 630 and 640, material nodes $650_1$ to $650_N$, and material nodes $660_1$ to $660_M$. The exemplary reducer tree 600 shown in FIG. 6 may be particularly applicable to use cases in which an object is to be designed with desired mechanical properties in addition to desired texture (e.g., exterior color) properties. For example, reducer tree 600 may be particularly applicable to design of an object like object 100 shown in FIG. 1 in that both an exterior texture is desired in addition to particular mechanical properties.

In the example of FIG. 6, geometry node 620 subdivides an input shape based on a stratum, which subdivides a volume through points that have a constant distance from the surface of the shape. In the exemplary representation 681, representing a two-dimensional cross-section through a three-dimensional volume, the subdivision divides the volume into an exterior (surface) sub-region and an interior (bulk) sub-region. The entire surface of the three-dimensional volume is thereby provided in one sub-region.

Geometry node 620 is configured to use a single parameter corresponding to a distance to determine where to subdivide an input volume (e.g., may subdivide at points located that distance from the surface). A stratum subdivision may be particularly helpful to identify a surface region of a shape so that one or more exterior properties, such as colors or patterns, can be optimized separately from one or more interior properties, such as mechanical properties.

Geometry node 640 is configured to subdivide the interior sub-region provided by geometry node 620 into voxels (volume elements) by dividing the interior sub-region into smaller, equally sized sub-regions (e.g., cubes). This results in identifying M sub-regions, whose materials are selected by material nodes $660_1$ to $660_M$, with a single material node determining the material of a single voxel-shaped sub-region.

As discussed above, associating a tuner with a node in a reducer tree may allow the tuner to optimize free parameters of the reducer tree at the associated node in addition to free parameters at all nodes below the associated node. In the example of FIG. 6, tuner 641 is configured to optimize parameters associated with the voxel subdivision performed by geometry node 640 in addition to the material selection by each of material nodes $660_1$ to $660_M$. Tuner 641 may, for example, perform a mechanical simulation of an object having a composition determined by reducer tree 600 to determine how to optimize free parameters associated with nodes 640 and $660_1$ to $660_M$.

Geometry node 630 is configured to subdivide the exterior sub-region provided by geometry node 620 into columns. In the example of FIG. 6, the region being subdivided into columns is an exterior sub-region of an input shape, and a subdivision performed by geometry node 630 creates sub-regions that have a square cross-section at the surface of the exterior sub-region and extend through the exterior sub-region. Determining a material for each of the column sub-regions identified by geometry node 630 therefore determines a material present in a sub-region at a surface, and may, for example, have a material based on a pixel of an image that represents a desired appearance of the object being designed. In the example of FIG. 6, material nodes $650_1$ to $650_N$ are configured to determine a material for each of the N columns identified by geometry node 630.

Tuners $660_1$ to $660_N$ are configured to optimize the selection of a material for each of the material nodes $650_1$ to $650_N$. Tuners $660_1$ to $660_N$ may, for example, perform a raytracing simulation of an object having a composition determined by reducer tree 600 to determine how to optimize the parameters associated with material nodes $650_1$ to $650_N$. In some embodiments, tuners $660_1$ to $660_N$ may be part of a tuner network, which as discussed above, may allow the tuners to share information and improve the optimization of the parameters of material nodes $650_1$ to $650_N$.

Figure 7:
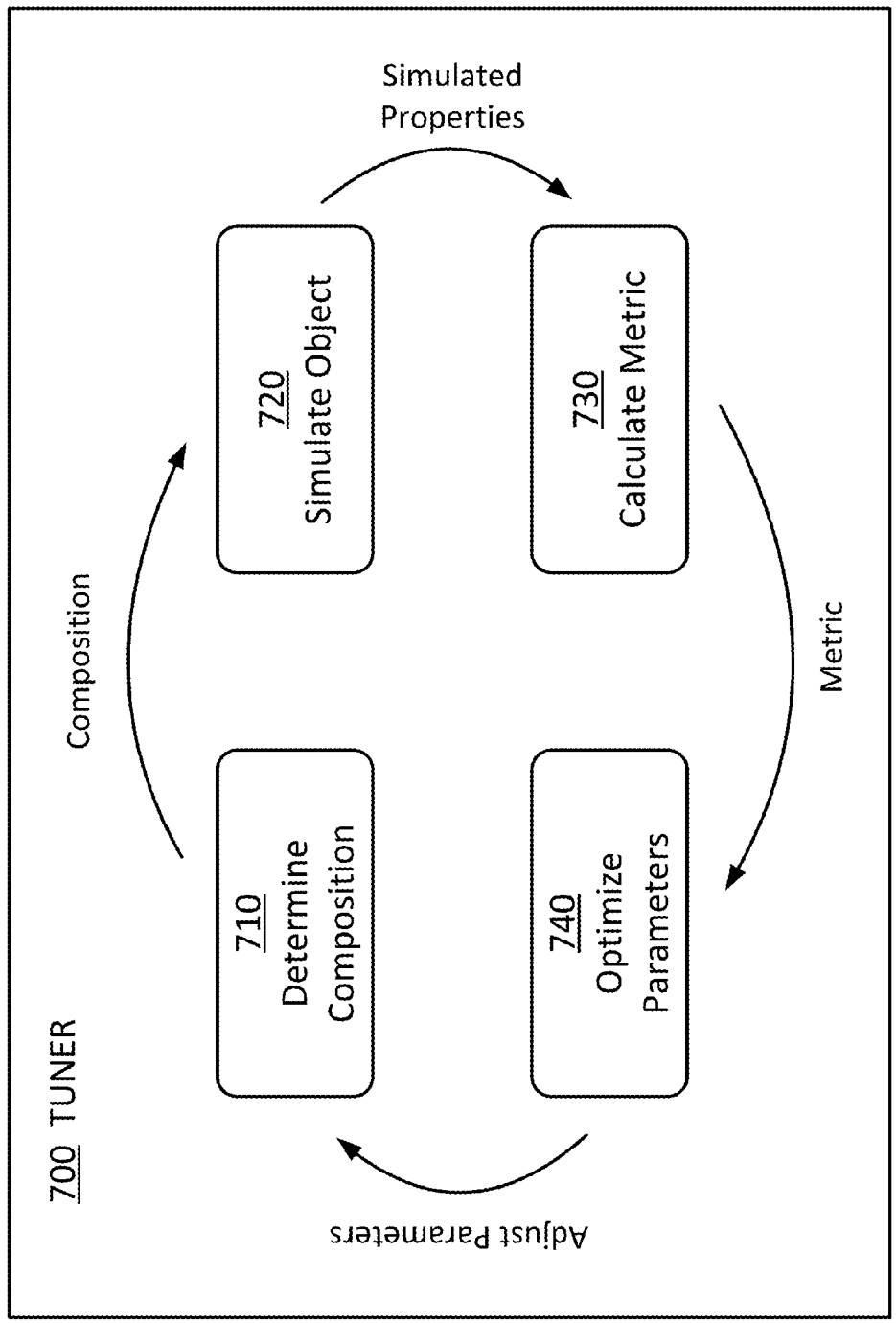
FIG. 7 depicts operation of a tuner in conjunction with a reducer tree, according to some embodiments.

FIG. 7 depicts operation of a tuner in conjunction with a reducer tree, according to some embodiments. As discussed above, a tuner may be associated with one or more parameters that determine a composition of an object to be designed. In some embodiments, a tuner is associated with one or more nodes of a reducer tree, thereby associating the tuner with one or more free parameters of those nodes. A tuner as described herein and depicted in FIG. 7 may be used with any suitable approach for parameterizing the determination of a composition of an object, including but not limited to approaches that utilize a reducer tree to parameterize the determination of the composition.

Tuner 700 is configured to perform steps 710-740 to optimize one or more parameters that, at least in part, determine a composition of an object being designed. In step 710, a composition of an object being designed is determined. The composition may be determined in any suitable way, examples of which are discussed above, and may be determined based at least in part on one or more parameters that tuner 700 is configured to optimize. It will be appreciated that tuner 700 may not be the only tuner operating to optimize parameters that determine the composition of the object being designed, and that accordingly tuner 700 may be configured to optimize either all or only a subset of the parameters.

The determined composition is used to produce one or more simulations of the object in step 720. Any number of any type of simulation may be performed in step 720. For example, in step 720 the tuner may perform, or cause to be performed, a mechanical simulation of the object using the determined composition. Alternatively, or additionally, in step 720 the tuner may perform, or cause to be performed, an optical (e.g., raytracing) simulation of the object using the determined composition. In some embodiments, tuner 700 is part of a tuner network and at least a portion of the tuner network shares one or more simulations. For example, a plurality of tuners in a tuner network may optimize parameters for one or more mechanical properties of an object being designed. In this example, a single mechanical simulation may be performed and the plurality of tuners may each access one or more properties determined by the simulation in order to optimize parameters associated with the tuner.

Irrespective of the type and number of simulations performed, one or more properties are determined based on the simulation and provided to step 730. In step 730, a metric is determined that is a measure of similarity between one or more simulated properties determined in step 720 and one or more desired properties. For example, tuner 700 may determine a Young's modulus of an object in step 720 and compare the value with a desired value in step 730, calculating the metric as a measurement of how different the two values are. Any suitable metric may be used in step 730 that measures a distance between one or more desired properties and one or more corresponding simulated properties. A metric may, for example, reflect the difference between a first simulated property and a first desired property in addition to a difference between a second simulated property and a second desired property, as a plurality of differences may be reflected in a single calculated metric. In some embodiments, a metric is calculated based on an 12 norm. In some embodiments, in particular in embodiments in which one or more optical properties of an object are determined through simulation, a metric may be, or may be based on, a visible difference predictor. In some embodiments, a metric is calculated from an 12 norm of pixel color values, such as a pixel color representing a desired property and a pixel color representing a simulated property.

The metric calculated in step 730 is provided to step 740, in which the one or more parameters associated with tuner 700 are optimized, thereby determining updated values for the one or more parameters (which may be the same or different as the previous values, though generally will be different while the design is optimized). Optimization may be performed in any suitable way, such as but not limited to, simulated annealing, Monte-Carlo sampling, interval methods, Bayesian optimization, or combinations thereof.

In step 710, another composition of the object is determined based at least in part of the updated parameter values determined in step 740, and the process of determining the design may continue with step 720, 730, etc. The tuner may continue to perform the steps for any suitable period, until the determined parameters are used to determine the design for the object. In some embodiments, the tuner performs steps 710-740 until the metric calculated in step 730 falls below a threshold value. In some embodiments, the tuner performs steps 710-740 until another tuner in a tuner network with tuner 700 indicates that optimization should cease (e.g., the other tuner determines that its calculated metric has fallen below a threshold value). In some embodiments, tuner 700 performs steps 710-740 for a number of iterations and the set of parameters being optimized that, during those iterations, resulted in the smallest difference reported by the metric is chosen for the design for the object. In some embodiments, a user may choose to stop tuner 700 from performing steps 710-740 (e.g., if the user is satisfied that the tuner has optimized sufficiently, such as based on a current optimized result).

FIG. 8 illustrates an example of a suitable computing system environment 800 on which aspects of the invention may be implemented. For example, the computing system environment 800 may be used to determine the supportedness of one or more regions of an object, to generate a support structure for an object, to generate support tips for a support structure, to indicate the supportedness of one or more regions of an object via a graphical user interface, to interface with one or more devices to effect additive fabrication of an object and/or a support structure, or any combinations thereof. Such a computing environment may represent a home computer, a tablet, a mobile device, a server and/or any another computing device.

The computing system environment 800 is only one example of a suitable computing environment and is not intended to suggest any limitation as to the scope of use or functionality of the invention. Neither should the computing environment 800 be interpreted as having any dependency or requirement relating to any one or combination of components illustrated in the exemplary operating environment 800.

Aspects of the invention are operational with numerous other general purpose or special purpose computing system environments or configurations. Examples of well-known computing systems, environments, and/or configurations that may be suitable for use with the invention include, but are not limited to, personal computers, server computers, hand-held or laptop devices, multiprocessor systems, microprocessor-based systems, set top boxes, programmable consumer electronics, network PCs, minicomputers, mainframe computers, distributed computing environments that include any of the above systems or devices, and the like.

The computing environment may execute computer-executable instructions, such as program modules. Generally, program modules include routines, programs, objects, components, data structures, etc. that perform particular tasks or implement particular abstract data types. The invention may also be practiced in distributed computing environments where tasks are performed by remote processing devices that are linked through a communications network. In a distributed computing environment, program modules may be located in both local and remote computer storage media including memory storage devices.

With reference to FIG. 8, an exemplary system for implementing aspects of the invention includes a general purpose computing device in the form of a computer 810. Components of computer 810 may include, but are not limited to, a processing unit 820, a system memory 830, and a system bus 821 that couples various system components including the system memory to the processing unit 820. The system bus 821 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

Computer 810 typically includes a variety of computer readable media. Computer readable media can be any available media that can be accessed by computer 810 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by computer 810. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer readable media.

The system memory 830 includes computer storage media in the form of volatile and/or nonvolatile memory such as read only memory (ROM) 831 and random access memory (RAM) 832. A basic input/output system 833 (BIOS), containing the basic routines that help to transfer information between elements within computer 810, such as during start-up, is typically stored in ROM 831. RAM 832 typically contains data and/or program modules that are immediately accessible to and/or presently being operated on by processing unit 820. By way of example, and not limitation, FIG. 8 illustrates operating system 834, application programs 835, other program modules 836, and program data 837.

The computer 810 may also include other removable/non-removable, volatile/nonvolatile computer storage media. By way of example only, FIG. 8 illustrates a hard disk drive 841 that reads from or writes to non-removable, nonvolatile magnetic media, a magnetic disk drive 851 that reads from or writes to a removable, nonvolatile magnetic disk 852, and an optical disk drive 855 that reads from or writes to a removable, nonvolatile optical disk 856 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 841 is typically connected to the system bus 821 through an non-removable memory interface such as interface 840, and magnetic disk drive 851 and optical disk drive 855 are typically connected to the system bus 821 by a removable memory interface, such as interface 850.

The drives and their associated computer storage media discussed above and illustrated in FIG. 8, provide storage of computer readable instructions, data structures, program modules and other data for the computer 810. In FIG. 8, for example, hard disk drive 841 is illustrated as storing operating system 844, application programs 845, other program modules 846, and program data 847. Note that these components can either be the same as or different from operating system 834, application programs 835, other program modules 836, and program data 837. Operating system 844, application programs 845, other program modules 846, and program data 847 are given different numbers here to illustrate that, at a minimum, they are different copies. A user may enter commands and information into the computer 810 through input devices such as a keyboard 862 and pointing device 861, commonly referred to as a mouse, trackball or touch pad. Other input devices (not shown) may include a microphone, joystick, game pad, satellite dish, scanner, or the like. These and other input devices are often connected to the processing unit 820 through a user input interface 860 that is coupled to the system bus, but may be connected by other interface and bus structures, such as a parallel port, game port or a universal serial bus (USB). A monitor 891 or other type of display device is also connected to the system bus 821 via an interface, such as a video interface 890. In addition to the monitor, computers may also include other peripheral output devices such as speakers 897 and printer 896, which may be connected through a output peripheral interface 895.

The computer 810 may operate in a networked environment using logical connections to one or more remote computers, such as a remote computer 880. The remote computer 880 may be a personal computer, a server, a router, a network PC, a peer device or other common network node, and typically includes many or all of the elements described above relative to the computer 810, although only a memory storage device 881 has been illustrated in FIG. 8. The logical connections depicted in FIG. 8 include a local area network (LAN) 871 and a wide area network (WAN) 873, but may also include other networks. Such networking environments are commonplace in offices, enterprise-wide computer networks, intranets and the Internet.

When used in a LAN networking environment, the computer 810 is connected to the LAN 871 through a network interface or adapter 870. When used in a WAN networking environment, the computer 810 typically includes a modem 872 or other means for establishing communications over the WAN 873, such as the Internet. The modem 872, which may be internal or external, may be connected to the system bus 821 via the user input interface 860, or other appropriate mechanism. In a networked environment, program modules depicted relative to the computer 810, or portions thereof, may be stored in the remote memory storage device. By way of example, and not limitation, FIG. 8 illustrates remote application programs 885 as residing on memory device 881. It will be appreciated that the network connections shown are exemplary and other means of establishing a communications link between the computers may be used.

The various methods or processes outlined herein may be implemented in any suitable hardware. Additionally, the various methods or processes outlined herein may be implemented in a combination of hardware and of software executable on one or more processors that employ any one of a variety of operating systems or platforms. For example, the various methods or processes may utilize software to instruct a processor to perform optimization of one or more reducer tree nodes using one or more tuners. Example of such approaches are described above. However, any suitable combination of hardware and software may be employed to realize any of the embodiments discussed herein.

In this respect, various inventive concepts may be embodied as at least one non-transitory computer readable storage medium (e.g., a computer memory, one or more floppy discs, compact discs, optical discs, magnetic tapes, flash memories, circuit configurations in Field Programmable Gate Arrays or other semiconductor devices, etc.) encoded with one or more programs that, when executed on one or more computers or other processors, implement the various embodiments of the present invention. The non-transitory computer-readable medium or media may be transportable, such that the program or programs stored thereon may be loaded onto any computer resource to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion among different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Having herein described several embodiments, several advantages of embodiments of the present application should be apparent. One advantage is that an object may be designed based on any number of available materials such that the object, when fabricated, exhibits one or more desired properties. A non-limiting list of applications for which embodiments described herein may be used include optics, mechanical engineering, industrial design, aerospace design, musical instruments, toys and games, and combinations thereof.

Furthermore, the techniques described herein may, in some embodiments, provide in an approach to designing an object that is modular, extensible, independent of object geometry and/or independent of a fabrication device which may be used to subsequently fabricate the object. For example, in some embodiments a reducer tree may be described by modular code which includes reusable code for one or more of the nodes in the reducer tree. In some embodiments, a reducer tree may be extended by including additional aspects not expressly described herein, such as one or more geometry nodes that identify sub-regions of a volume using a different scheme than is discussed in the above examples. In some embodiments, design of an object may be determined independently of an input geometry representing a shape of the object, such as by designing the object using a reducer tree configured to produce a design of an object based on an input shape that establishes a composition of that shape independent of the geometry of the shape itself. In some embodiments, a design of an object may be determined independently of a type of fabrication device that may be subsequently used to fabricate the designed object. For example, while one or more material properties may be provided as input to the design process, these materials may not uniquely correspond to a particular fabrication device or fabrication process.

Various inputs to the design of a three-dimensional object have been discussed above, and it will be appreciated that any number of inputs may be considered in designing an object using the techniques describer herein. A non-limiting list of suitable inputs may include an input shape (e.g., a geometrical object), one or more desired properties of the object to be designed, a simulation configuration (e.g., the number and type of simulations, the parameters describing a composition of the object that are associated with each simulation, etc.), one or more materials from which the object may be fabricated, one or more properties of the one or more materials (e.g., mechanical properties, cost, weight/density, thermal properties, electrical properties, etc.), details on a fabrication technique (e.g., specifications of an additive fabrication system, such as a resolution; time to fabrication based on an object composition), or combinations thereof.

An input shape may be described using any suitable format, including any data that defines a three-dimensional geometry (e.g., by defining positions of vertices, normals and/or faces). A non-limiting list of suitable formats for an input shape may include STereoLithography (STL), Wavefront OBJ, Additive Manufacturing File Format (AMF), ObjDF, Stratasys SLC, Zmodeler Z3D, Lightwave LWO, Autodesk Maya and/or 3D Studio Max, etc.

While techniques described herein have, in some cases, been described as designing an object suitable for use in additive fabrication, it will be appreciated that the techniques described herein are not limited to designing objects to be fabricated using additive fabrication, and may be used to design an object completely independent of whether any subsequent fabrication of the object might occur. For example, the techniques described herein may be used to design an object that is not fabricated, which may be useful, for example, for a designer to explore how an object might be designed without taking the step of physically fabricating the object. In use cases in which an object designed using one or more of the techniques described herein is fabricated, any suitable type of fabrication approach may be used including, but not limited to, additive fabrication (including stereolithography, selective or fused deposition modeling, direct composite manufacturing, laminated object manufacturing, selective phase area deposition, multi-phase jet solidification, ballistic particle manufacturing, particle deposition, laser sintering, polyjet, or combinations thereof), computer numerical control (CNC) machining, or any combination thereof.

Various inventive concepts may be embodied as one or more methods, of which examples have been provided. The acts performed as part of any method described herein may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein, unless clearly indicated to the contrary, should be understood to mean "at least one."

As used herein, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting.

What is claimed is:

1. A computer-implemented method of designing an object based on a three-dimensional model representing a shape of the object, the object to be fabricated from a plurality of materials having one or more known physical properties, wherein the object is designed to exhibit one or more target properties, comprising:

determining a first composition of the object by providing the three-dimensional model as input to a reducer tree, the reducer tree being configured to identify a first plurality of sub-regions of the model each having a size and a shape, and to select a material of the plurality of materials for each of the first plurality of sub-regions;

determining one or more physical properties of the object with the first composition by simulating the object with the first composition;

comparing the determined one or more physical properties with the one or more target properties;

determining, by the reducer tree, a second composition of the object based on a result of comparing the determined one or more physical properties with the one or more target properties by identifying a second plurality of sub-regions of the model and selecting one of the plurality of materials for each of the second plurality of identified sub-regions; and fabricating the object according to the second composition via one or more additive fabrication techniques.

2. The method of claim 1, wherein identifying the first plurality of sub-regions of the model and selecting a material of the plurality of materials for each of the first plurality of sub-regions by the reducer tree is based, at least in part, on a plurality of parameters.

3. The method of claim 2, wherein determining, by the reducer tree, a second composition of the object comprises optimizing one or more of the plurality of parameters based on the result of comparing the determined one or more physical properties with the one or more target properties.

4. The method of claim 1, wherein the first plurality of sub-regions of the model include a first sub-region having a first size and a first shape, and a second sub-region having a second size, different from the first size, and a second shape, different from the first shape.

5. The method of claim 1, wherein simulating the object with the first composition comprises a mechanical simulation.

6. The method of claim 1, wherein simulating the object with the first composition comprises an optical simulation.

7. The method of claim 1, further comprising determining a metric based on the comparing of the determined one or more physical properties with the one or more target properties.

8. The method of claim 1, wherein the one or more target properties comprise one or more optical, acoustic and/or mechanical properties.

9. The method of claim 1, wherein the plurality of materials comprise Acrylonitrile Butadiene Styrene (ABS) and/or a photopolymer.

10. At least one non-transitory computer-readable medium comprising instructions that, when executed, perform a method of designing an object based on a three-dimensional model representing a shape of the object, the object to be fabricated from a plurality of materials having one or more known physical properties, wherein the object is designed to exhibit one or more target properties, the method comprising:

determining a first composition of the object by providing the three-dimensional model as input to a reducer tree, the reducer tree being configured to identify a first plurality of sub-regions of the model each having a size and a shape, and to select a material of the plurality of materials for each of the first plurality of sub-regions;

determining one or more physical properties of the object with the first composition by simulating the object with the first composition;

comparing the determined one or more physical properties with the one or more target properties;

determining, by the reducer tree, a second composition of the object based on a result of comparing the determined one or more physical properties with the one or more target properties by identifying a second plurality of sub-regions of the model and selecting one of the plurality of materials for each of the second plurality of identified sub-regions; and providing instructions to an additive fabrication device to cause the additive fabrication device to fabricate the object according to the second composition.

11. The at least one non-transitory computer-readable medium of claim 10, wherein identifying the first plurality of sub-regions of the model and selecting a material of the plurality of materials for each of the first plurality of sub-regions by the reducer tree is based, at least in part, on a plurality of parameters.

12. The at least one non-transitory computer-readable medium of claim 11, wherein determining, by the reducer tree, a second composition of the object comprises optimizing one or more of the plurality of parameters based on the result of comparing the determined one or more physical properties with the one or more target properties.

13. The at least one non-transitory computer-readable medium of claim 10, wherein the first plurality of sub-regions of the model include a first sub-region having a first size and a first shape, and a second sub-region having a second size, different from the first size, and a second shape, different from the first shape.

14. The at least one non-transitory computer-readable medium of claim 10, wherein simulating the object with the first composition comprises a mechanical simulation.

15. The at least one non-transitory computer-readable medium of claim 10, wherein simulating the object with the first composition comprises an optical simulation.

16. The at least one non-transitory computer-readable medium of claim 10, the method further comprising determining a metric based on the comparing of the determined one or more physical properties with the one or more target properties.

17. The at least one non-transitory computer-readable medium of claim 10, wherein the one or more target properties comprise one or more optical, acoustic and/or mechanical properties.

18. The at least one non-transitory computer-readable medium of claim 10, wherein the plurality of materials comprise Acrylonitrile Butadiene Styrene (ABS) and/or a photopolymer.

19. A system for designing an object based on a three-dimensional model representing a shape of the object, the object to be fabricated from a plurality of materials having one or more known physical properties, wherein the object is designed to exhibit one or more target properties, the system comprising:
at least one processor configured to:
determine a first composition of the object by providing the three-dimensional model as input to a reducer tree, the reducer tree being configured to identify a first plurality of sub-regions of the model each having a size and a shape, and to select a material of the plurality of materials for each of the first plurality of sub-regions;
determine one or more physical properties of the object with the first composition by simulating the object with the first composition;
compare the determined one or more physical properties with the one or more target properties;
determine, via the reducer tree, a second composition of the object based on a result of comparing the determined one or more physical properties with the one or more target properties by identifying a second plurality of sub-regions of the model and selecting one of the plurality of materials for each of the second plurality of identified sub-regions; and
provide instructions to an additive fabrication device to cause the additive fabrication device to fabricate the object according to the second composition.

20. The system of claim 19, wherein identifying the first plurality of sub-regions of the model and selecting a material of the plurality of materials for each of the first plurality of sub-regions by the reducer tree is based, at least in part, on a plurality of parameters.

21. The system of claim 20, wherein determining, by the reducer tree, a second composition of the object comprises optimizing one or more of the plurality of parameters based on the result of comparing the determined one or more physical properties with the one or more target properties.

22. The system of claim 19, wherein the first plurality of sub-regions of the model include a first sub-region having a first size and a first shape, and a second sub-region having a second size, different from the first size, and a second shape, different from the first shape.

23. The system of claim 19, wherein simulating the object with the first composition comprises a mechanical simulation.

24. The system of claim 19, wherein simulating the object with the first composition comprises an optical simulation.

25. The system of claim 19, the at least one processor further configured to determine a metric based on the comparing of the determined one or more physical properties with the one or more target properties.

26. The system of claim 19, wherein the one or more target properties comprise one or more optical, acoustic and/or mechanical properties.

27. The system of claim 19, wherein the plurality of materials comprise Acrylonitrile Butadiene Styrene (ABS) and/or a photopolymer.

* * * * *